United States Patent
Dong et al.

(10) Patent No.: US 11,381,011 B2
(45) Date of Patent: Jul. 5, 2022

(54) CARD EDGE CONNECTOR WITH REINFORCED ROTATABLE EJECTOR AT ONE END

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Yuan-Yuan Dong, Kunshan (CN); Xiao-Hu Yin, Huaian (CN); Wen-Jun Tang, Kunshan (CN); Xue-Wu Bu, Kunshan (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

(21) Appl. No.: 17/118,629

(22) Filed: Dec. 11, 2020

(65) Prior Publication Data
US 2021/0184377 A1 Jun. 17, 2021

(30) Foreign Application Priority Data
Dec. 11, 2019 (CN) .......................... 201922215790.6

(51) Int. Cl.
*H01R 12/70* (2011.01)
*H01R 13/633* (2006.01)
(Continued)

(52) U.S. Cl.
CPC ....... *H01R 12/7005* (2013.01); *H01R 12/721* (2013.01); *H01R 13/62988* (2013.01);
(Continued)

(58) Field of Classification Search
CPC .................. H01R 12/7005; H01R 13/633; H01R 12/721; H01R 13/639
(Continued)

(56) References Cited

U.S. PATENT DOCUMENTS 5,004,431 A * 4/1991 Previato ............. H01R 13/6278
439/358
5,302,133 A * 4/1994 Tondreault ........... H01R 13/633
439/157
(Continued)

FOREIGN PATENT DOCUMENTS

GN 109888558 A 6/2019

*Primary Examiner* — Neil Abrams
(74) *Attorney, Agent, or Firm* — Ming Chieh Chang; Wei Te Chung

(57) ABSTRACT

An electrical connector includes an insulative elongated housing with an elongate central slot for receiving a daughter card, a plurality of contacts disposed in the housing by two sides of the central slot, and a mounting section located at one end of the housing with a unitary ejector pivotally mounted therein. The ejector forms a receiving slot for receiving the daughter board, and a pair of engagement arms located by two opposite sides of the receiving slot with corresponding hook at front ends to be engaged within corresponding engagement slots formed in the mounting section. Each deflectable engagement arms includes a metal piece associated therewith not only preventing breaking of the deflectable engagement arm during rotation of the ejector but also enhancing engagement between the ejector and the housing.

15 Claims, 9 Drawing Sheets

(51) Int. Cl.
*H05K 7/14* (2006.01)
*H01R 12/72* (2011.01)
*H01R 13/639* (2006.01)
*H01R 13/629* (2006.01)

(52) U.S. Cl.
CPC ......... *H01R 13/633* (2013.01); *H01R 13/639* (2013.01); *H05K 7/1409* (2013.01)

(58) Field of Classification Search
USPC ........................................................ 439/160
See application file for complete search history.

(56) References Cited

U.S. PATENT DOCUMENTS

| | | | | |
|---|---|---|---|---|
| 5,443,394 A * | 8/1995 | Billman | ............ | H01R 12/7005 439/155 |
| 5,746,613 A * | 5/1998 | Cheng | ................. | H05K 7/1409 439/157 |
| 5,997,331 A * | 12/1999 | Tu | ..................... | H01R 13/6273 439/328 |
| 6,390,837 B1 * | 5/2002 | Lee | ................... | H01R 12/7005 439/160 |
| 7,252,523 B1 * | 8/2007 | Pennypacker | ....... | H05K 7/1431 439/157 |
| 7,500,863 B2 * | 3/2009 | Ringler | .............. | H01R 13/6275 439/159 |
| 7,677,907 B2 * | 3/2010 | Guan | .................. | H01R 12/721 439/157 |
| 7,922,506 B1 * | 4/2011 | Harlan | ................. | H01R 12/737 439/160 |
| 8,517,746 B2 * | 8/2013 | Manickam | ......... | H01R 12/7005 439/160 |
| 8,585,417 B2 * | 11/2013 | Chien | ................ | H01R 12/7005 439/157 |
| 8,616,903 B2 * | 12/2013 | Li | ........................ | H01R 12/721 439/157 |
| 8,636,528 B2 * | 1/2014 | Sass | ................... | H01R 12/7029 439/157 |
| 8,657,612 B2 * | 2/2014 | Lu | ....................... | H01R 12/7011 439/160 |
| 8,665,587 B2 * | 3/2014 | Peng | ...................... | G06F 1/185 361/679.32 |
| 9,385,452 B2 * | 7/2016 | Fu | ....................... | H01R 12/7005 |
| 9,385,453 B2 * | 7/2016 | Yang | .................. | H05K 7/1409 |
| 10,056,715 B2 * | 8/2018 | Cai | .................. | H01R 13/62938 |
| 10,193,248 B2 * | 1/2019 | Shaw | ................. | H01R 12/7029 |
| 10,461,467 B2 * | 10/2019 | Eppley | ............. | H01R 13/6275 |
| 2007/0093097 A1 * | 4/2007 | Guan | ................. | H01R 12/7005 439/157 |
| 2020/0335903 A1 * | 10/2020 | Yuan | .................. | H01R 12/721 |
| 2021/0184377 A1 * | 6/2021 | Dong | .................. | H01R 12/721 |

\* cited by examiner

CARD EDGE CONNECTOR WITH REINFORCED ROTATABLE EJECTOR AT ONE END

1. FIELD OF THE DISCLOSURE

The invention is related to a card edge connector, and particularly to the connector with a reinforced rotatable ejector at one end.

2. DESCRIPTION OF RELATED ARTS

China Patent Application CN109888558A discloses a card edge connector with a locking mechanism to lock the daughter card. The locking mechanism includes a card holding part pivotally assembled upon the housing and a card locking part assembled upon the card holding part and moveable in a horizontal direction to lock into the notch of the daughter card. A metal securing piece is assembled upon the card locking part to engage the card holding part for assuring securement between the card holding part and the card locking part. Anyhow, the thickness of the discrete two parts compared with the traditional one piece ejector is relatively small, thus tending to be broken, and the relative movement between the card holding part and the card locking part may complicate the traditional simple rotation operation during ejecting the daughter card from the electrical connector.

It is desired to provide an electrical connector with a unitary ejector pivotally assembled to an end of the housing wherein a metal structure is embedded within the deflectable engagement arms so as to have the engagement arms reliably engaged with the housing for assuring the ejector is retained to the housing in a locking position.

SUMMARY OF THE DISCLOSURE

An electrical connector includes an insulative elongated housing with an elongate central slot for receiving a daughter card, a plurality of contacts disposed in the housing by two sides of the central slot, and a mounting section located at one end of the housing with a unitary ejector pivotally mounted therein. The ejector forms a receiving slot for receiving the daughter board, and a pair of engagement arms located by two opposite sides of the receiving slot with corresponding hook at front ends to be engaged within corresponding engagement slots formed in the mounting section. Each deflectable engagement arms includes a metal piece associated therewith not only preventing breaking of the deflectable engagement arm during rotation of the ejector but also enhancing engagement between the ejector and the housing.

DETAILED DESCRIPTION OF THE PREFERRED EMBODIMENT

Figure 1:
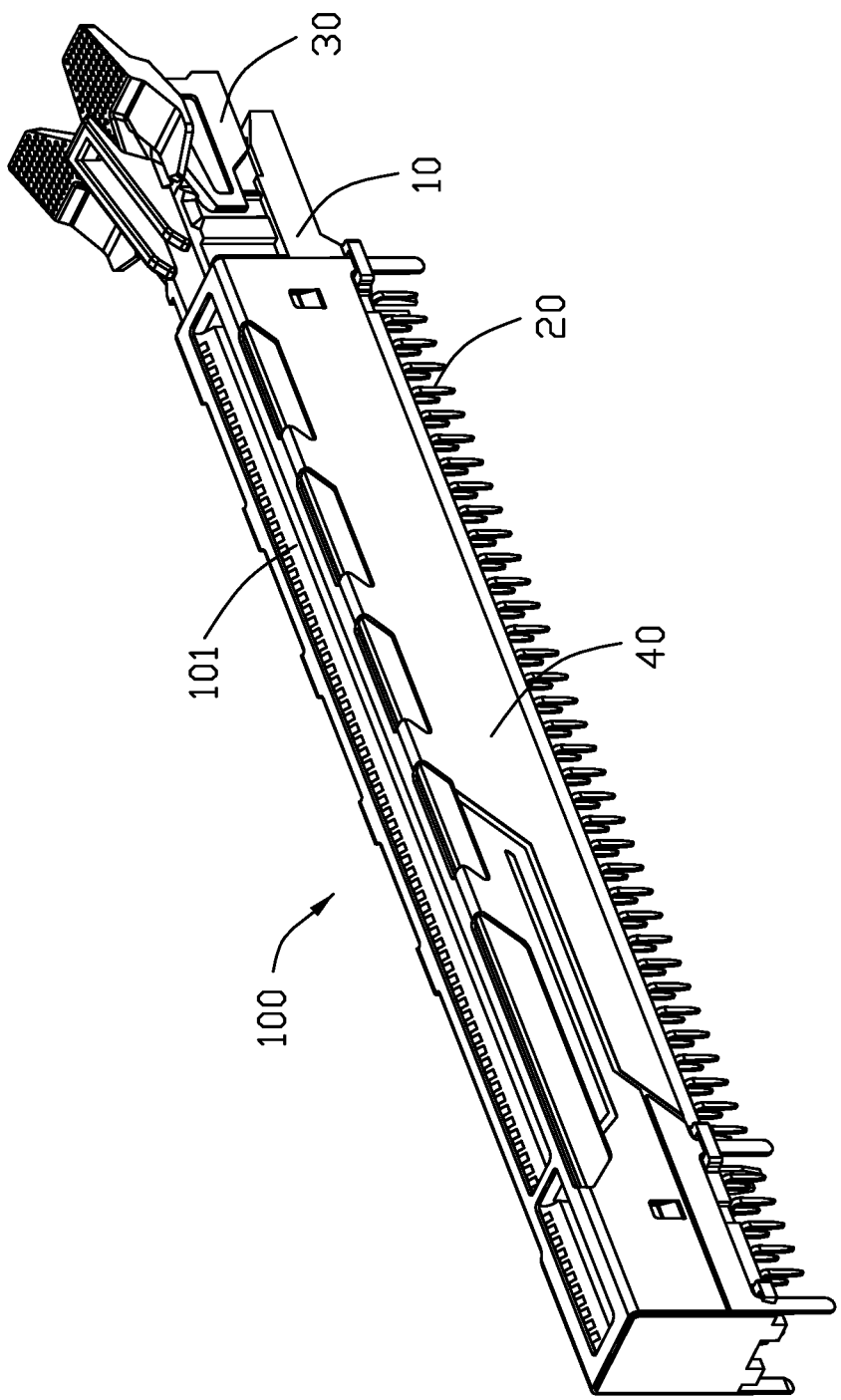
FIG. 1 is a perspective view of an electrical connector according to a first embodiment of the invention.
Figure 2:
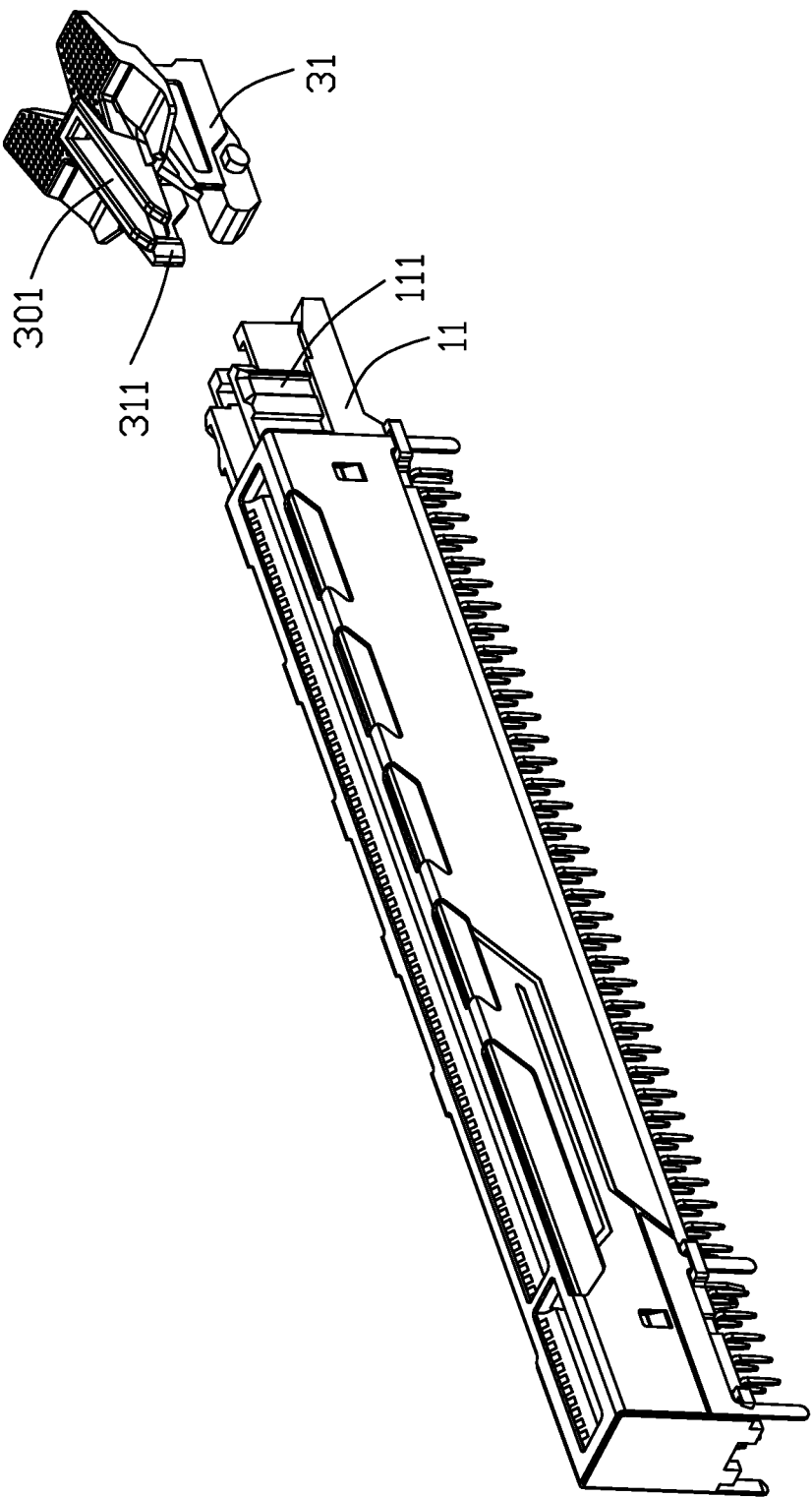
FIG. 2 is an exploded perspective view of the electrical connector of FIG. 1 wherein the ejector is removed away from the housing.
Figure 3:
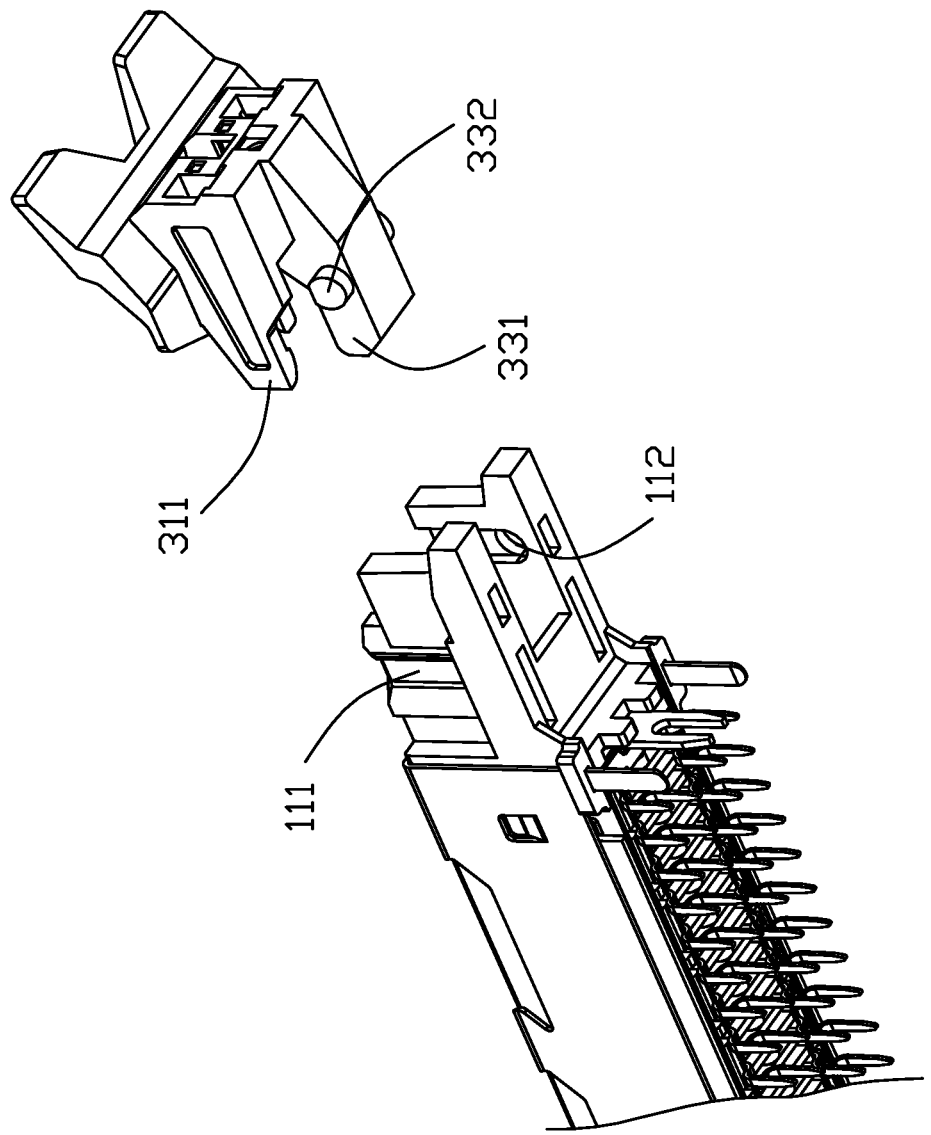
FIG. 3 is an enlarged exploded perspective view of a portion of the electrical connector of FIG. 2.
Figure 4:
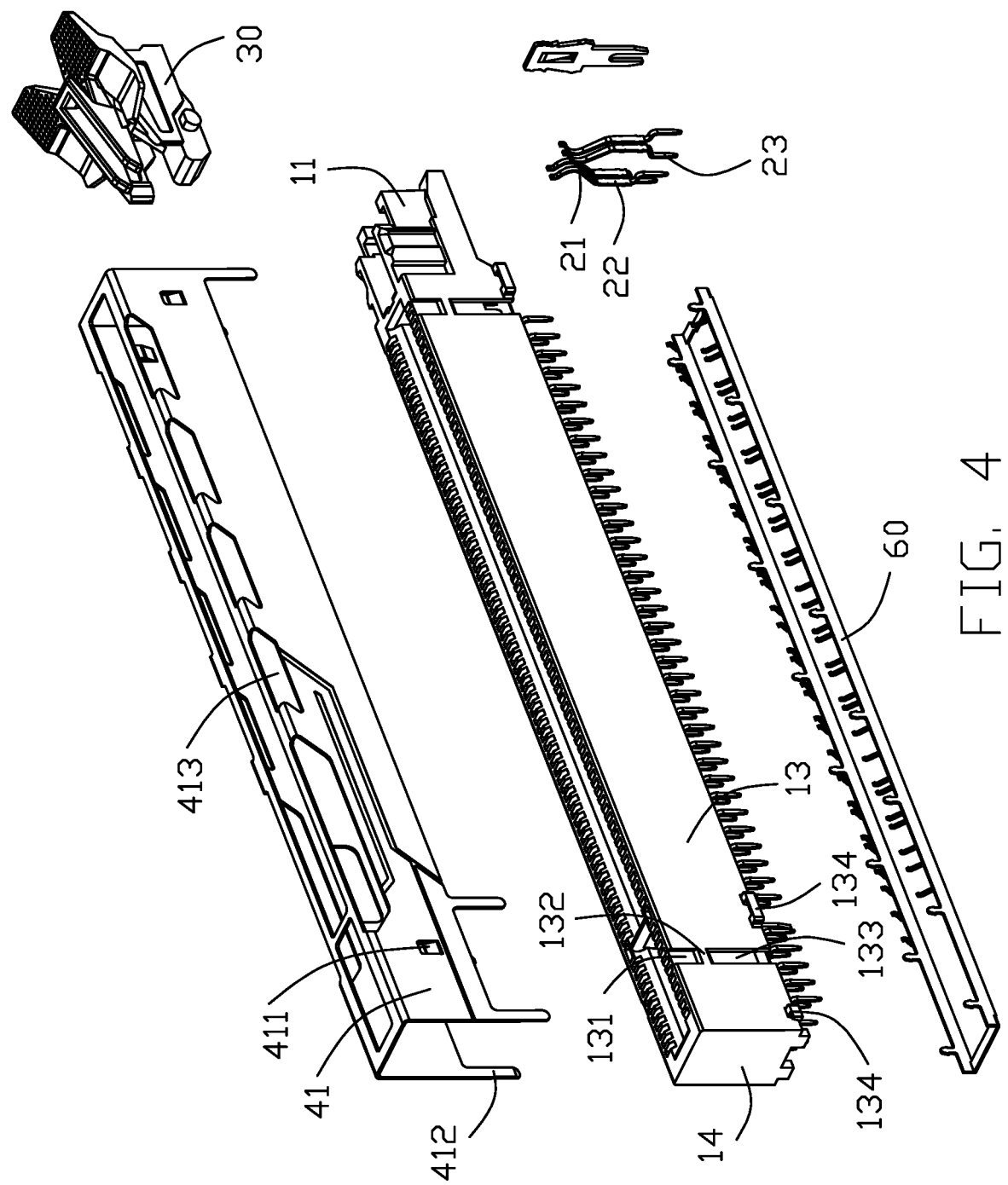
FIG. 4 is a further exploded perspective view of the electrical connector of FIG. 2.
Figure 5:
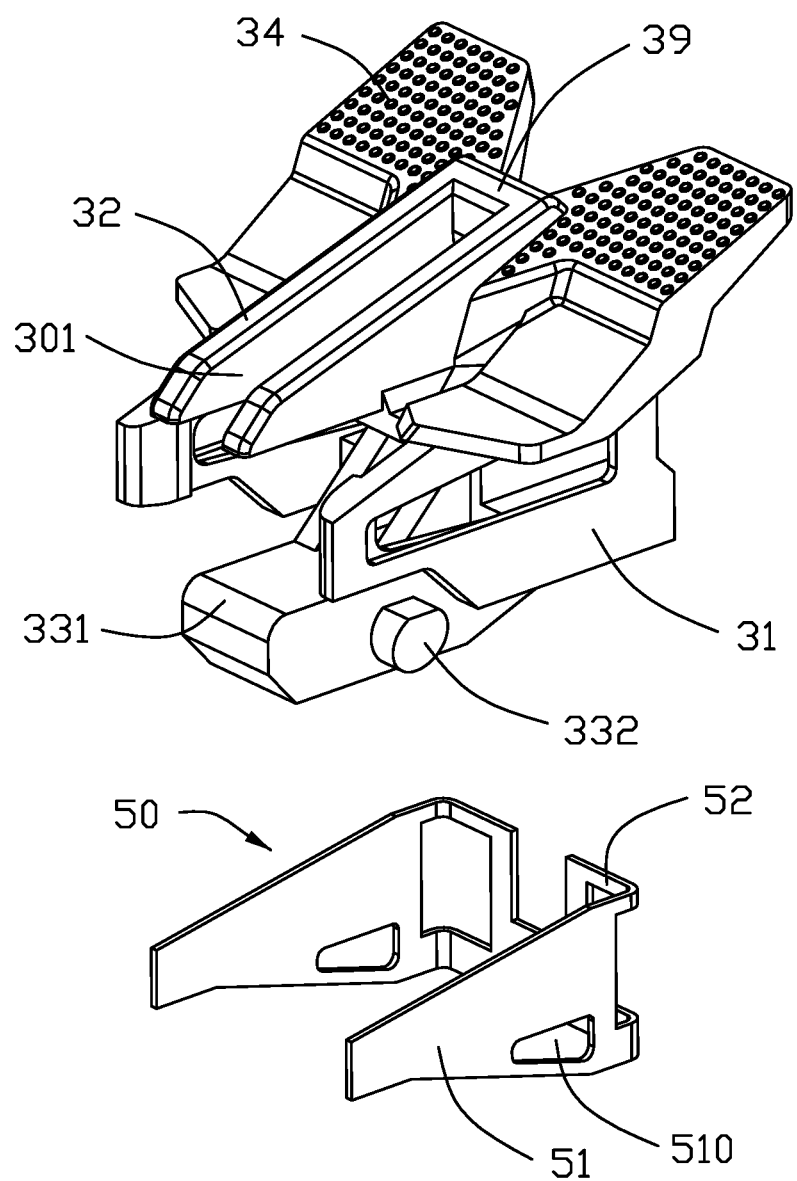
FIG. 5 is an exploded perspective view of the ejector of the electrical connector of FIG. 4.
Figure 6:
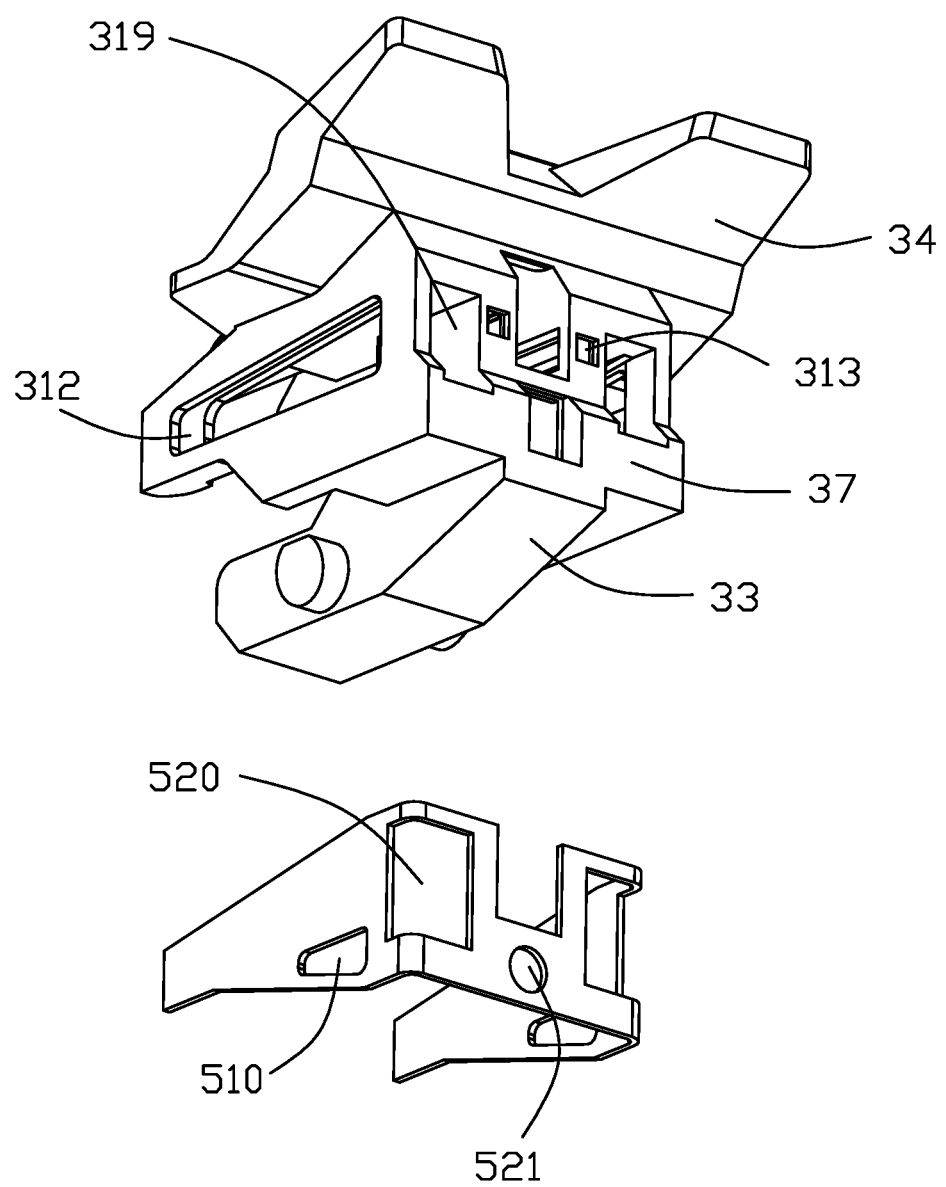
FIG. 6 is another exploded perspective view of the ejector of the electrical connector of FIG. 5.

A card edge connector 100 for receiving a daughter card (not shown) therein, includes an insulative elongated housing 10 defining an elongated central slot 101, two rows of contacts 20 disposed in the housing 10 by two sides of the central slot, a metallic shell 40 enclosing the housing 10, an ejector/locker 30 pivotally mounted on one end of the housing 10 for locking/ejecting the daughter card.

The housing 10 forms a pair of side walls 13 and a pair of end walls 14. The side wall 13 forms a pair of grooves 131, 133 with a rib 132 therebetween. The shell 40 includes a side plate 41 with the spring tang 411 to be received within the groove 133 and upwardly abutting against the rib 132 for retaining the shell 40 to the housing 10. The side plate 41 includes the mounting leg 412 extending through the lateral block 134 on the side wall 13 for mounting to the printed circuit board (not shown).

The contact 10 is disposed in the side wall 13 and includes the contacting section 21 extending into the central slot 101, the mounting leg 23 extending out of the housing 10 for mounting to the printed circuit board, and the retaining section 22 therebetween for retaining to the side wall 13. The contacts 2 include the grounding contact electrically linked together by the grounding bar 60.

The housing 10 includes a mounting section 11 forming engagement slots 111 in an exterior side. The ejector 30 is mounted in the mounting section 11 and forms a receiving slot 301 for receiving the side edge of the daughter card, and a pair of engagement arms 31 by two sides of the receiving slot 301. Each engagement arm 31 includes a hook 311 at the free end for engagement with the corresponding engagement slot 111 when the ejector 30 is moved to the upstanding locking position. Notably, because the engagement arm 31 is relatively thin tending to be broken during outward deflection during moving in-and-out with regard to the corresponding engagement slot 111, in the invention a metallic reinforcement piece 50 is embedded within the ejector 30 for reinforcing the corresponding engagement arm 31 not only for preventing its own breaking but also for engagement with the housing 10. A transverse wall 37 is formed between the pair of engagement arms 31 to form a pair of holes 313 and a pair of holes 319.

In this embodiment, the reinforcement piece 50 is exposed to an exterior through the corresponding hole 312 for having the reinforcement piece 50 insert-molded in the corresponding engagement arm 31. The reinforcement piece 50 includes a pair of side plates 51 linked by a connecting plate 52 which is exposed to an exterior through corresponding openings. In this embodiment, the reinforcement piece 50 is integrally formed within the ejector 30 via insert-molding. The side plate 51 is received within the corresponding engagement arm 31 and defines an opening 510 so as to have the material of the engagement arm 31 filled therein for securing consideration between the side plate 51 and the engagement arm 31 as well as the opening 521 formed in the connecting plate 52 with regard to the ejector 30. The connecting plate 52 further forms a pair of openings 520 in alignment with the corresponding openings 319 of the end wall 317 and further with the pair of hooks 311 for injection molding consideration. The a pair of holes 313 expose the connecting plate 52 in the longitudinal direction for injection molding consideration.

Figure 8:
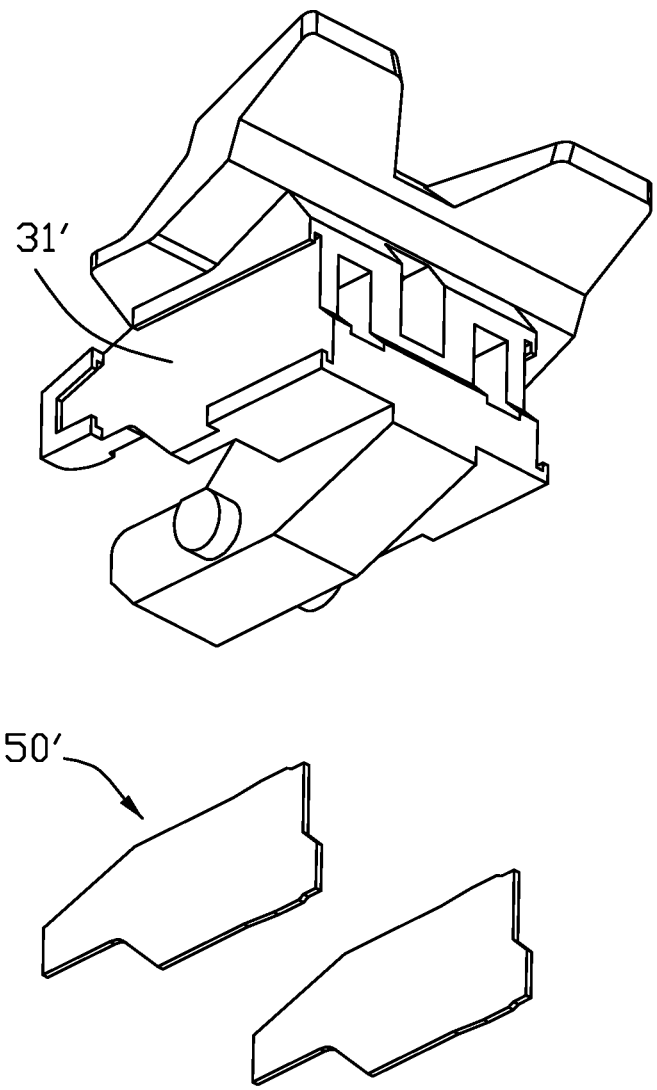
FIG. 8 is an exploded perspective view of the ejector of the electrical connector according to another embodiment of the invention.

In another embodiment, the reinforcement piece 50' may be two spaced side plates 51' without the connecting plate therebetween as shown in FIG. 8.

Figure 7:
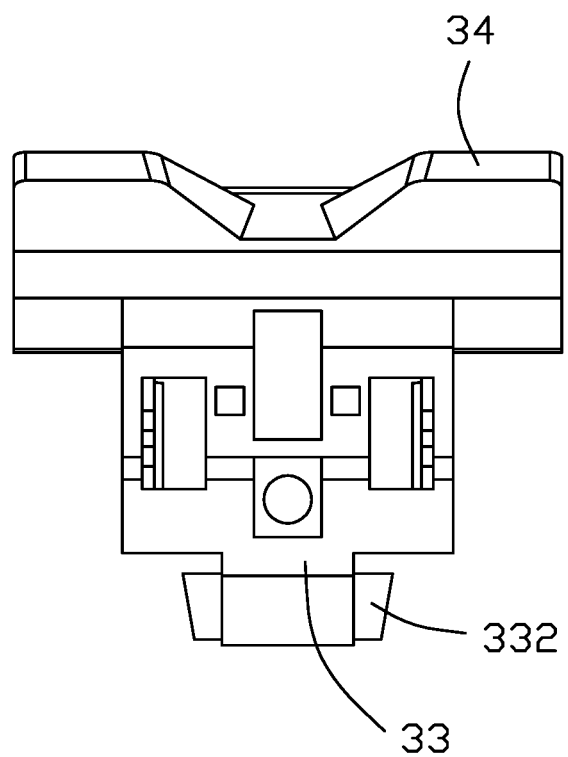
FIG. 7 is a side view of the ejector of the electrical connector of FIG. 6 along the longitudinal direction.
Figure 7A:
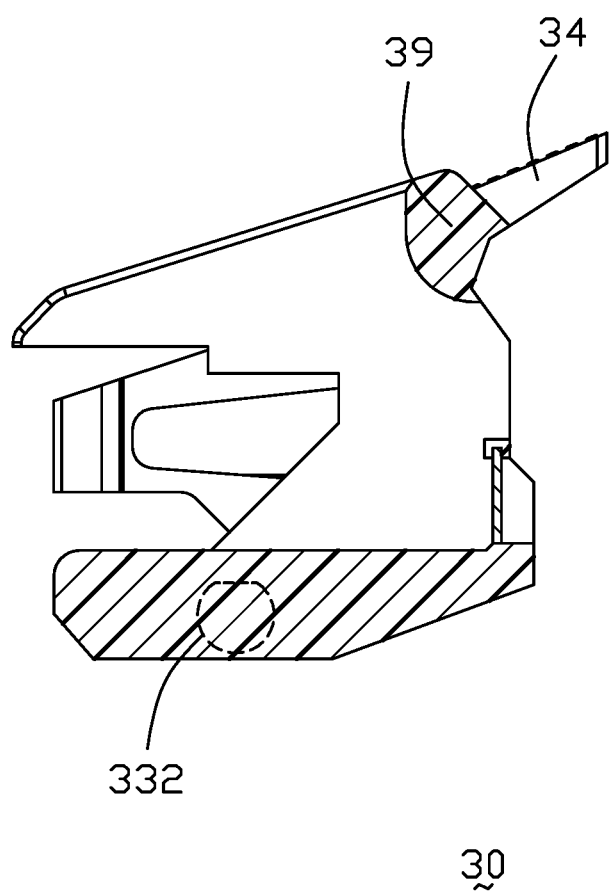
FIG. 7(A) is a cross-sectional view of the ejector of the electrical connector of FIG. 6.

In brief, the ejector 30 is made by plastic and includes further a pair of vertical walls 32 to form the receiving slot 301, and a bottom wall 33 to form an kicker 331 for upwardly ejecting the daughter card. A pair of pivots 332 are formed on two sides of the ejector 30 to be received within the corresponding pivot holes 112 formed in the mounting section 11. The engagement arms 31 are located by two sides of the pair of vertical walls 32. A pressing head 34 is formed on the engagement arm 31 so as to allow the user to downwardly press the pressing head to outwardly rotate the ejector 30 for ejecting the daughter card. As shown in FIG. 7(A), a locker 39 formed between the pair of pressing heads 34 and at the end of the receiving slot 301 in the longitudinal direction, is adapted to be received within the notch of the side edge of the daughter card for locking the daughter card in position.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. An electrical connector comprising:
   an insulative elongated housing defining an elongated slot along a longitudinal direction for receiving a daughter card and having a mounting section located at one end thereof in the longitudinal direction, a pair of engagement slots formed in exterior sides of the mounting section;
   a plurality of contacts located beside the elongated slot; and
   an ejector rotatably disposed in the mounting section and including:
   a pair of vertical walls forming a receiving slot aligned with the elongated slot in the longitudinal direction;
   a pair of deflectable engagement arms located by two sides of the pair of vertical walls in a transverse direction perpendicular to the longitudinal direction;
   a bottom wall located around bottom portions of the pair of vertical walls to form a kicker for upwardly ejecting the daughter card; and
   a pair of hooks formed on free ends of the pair of engagement arms, respectively, so as to be engaged within the corresponding engagement slots when the ejector is located in an upstanding locking position; wherein
   each engagement arm is equipped with a metal side plate embedded therein via an insert-molding process.

2. The electrical connector as claimed in claim 1, wherein each engagement arm forms an opening to outwardly expose the corresponding side plate in the transverse direction.

3. The electrical connector as claimed in claim 2, wherein the pair of side plates within the pair of engagement arms are linked with each other via a connecting plate extending in the transverse direction.

4. The electrical connector as claimed 3, wherein each vertical wall of the ejector forms a pressing head at an upper end, a locker is formed at an outer end of the receiving slot and between the pressing heads of the pair of vertical walls for locking the daughter card, and the connecting plate is essentially located below the locking head.

5. The electrical connector as claimed in claim 3, wherein the pair of engagement arms are linked by a transverse wall extending in the transverse direction.

6. The electrical connector as claimed in claim 5, wherein the transverse wall forms a pair of holes to expose the connecting plate in the longitudinal direction.

7. The electrical connector as claimed in claim 5, wherein the connecting plate forms a pair of holes, and the transverse wall forms another pair of holes in alignment with the pair of holes of the connecting plate and further with the pair of hooks of the pair of engagement arms.

8. The electrical connector as claimed in claim 1, wherein a pair of pivots are formed on two sides of the bottom wall.

9. The electrical connector as claimed in claim 1, wherein each side plate forms a hole filled with material of the corresponding engagement arm.

10. An ejector for use with an electrical connector having a mounting section at one end, comprising:
    a pair of vertical walls cooperating with a locker therebetween in transverse direction to form a receiving slot for receiving a daughter card;
    a pair of deflectable engagement arms located by two sides of the pair of vertical walls in the transverse direction;
    a pair of hooks formed on free ends of the engagement arms, respectively;
    a pair of metallic side plates integrally formed within the corresponding engagement arms via insert-molding, respectively;
    a bottom wall formed around bottom portions of the pair of vertical walls to form a kicker aligned with the receiving slot in a vertical direction perpendicular to the transverse direction for upwardly ejecting the daughter card; and
    a pair of pivots formed on two sides of the bottom wall.

11. The ejector as claimed in claim 10, wherein each engagement arms forms an opening to expose the corresponding side plates in the transverse direction.

12. The ejector as claimed in claim 10, wherein the pair of side plates are linked with each other by a connecting plate extending in a transverse direction.

13. The ejector as claimed in claim 12, wherein the pair of engagement arms are linked to each other via a transverse wall extending in the transverse direction, and the transverse wall forms a pair of holes aligned with a pair of openings in the connecting plate and further aligned with the pair of hooks in a longitudinal direction perpendicular to both the transverse direction and the vertical direction.

14. The ejector as claimed in claim 13, wherein the transverse wall has a pair of openings to expose the connecting plate in the longitudinal direction.

15. The ejector as claimed in claim 10, wherein each side plate forms a hole filled with material of the corresponding engagement arms.

* * * * *